United States Patent [19]

Cukier et al.

[11] 4,348,737
[45] Sep. 7, 1982

[54] MULTIPLE-FUNCTION PROGRAMMABLE LOGIC ARRAYS

[75] Inventors: Maurice Cukier, Vence; Daniel Sellier, La Gaude, both of France

[73] Assignee: International Business Machines Corporation, Armonk, N.Y.

[21] Appl. No.: 83,146

[22] Filed: Oct. 9, 1979

[30] Foreign Application Priority Data

Oct. 31, 1978 [FR] France .............................. 78 31281

[51] Int. Cl.³ ...................... H03K 19/00; H03K 19/08
[52] U.S. Cl. .................................... 364/900; 307/465
[58] Field of Search ... 364/200 MS File, 900 MS File, 364/716; 340/166 R, 147 R, 147 D, 825, 825.22, 825.83; 307/465

[56] References Cited

U.S. PATENT DOCUMENTS

| | | | |
|---|---|---|---|
| 3,983,538 | 9/1976 | Jones | 364/900 |
| 4,037,089 | 7/1977 | Horninger | 364/900 |
| 4,153,943 | 5/1979 | Anderson | 364/900 |

*Primary Examiner*—Raulfe B. Zache
*Assistant Examiner*—John G. Mills, III
*Attorney, Agent, or Firm*—Paul C. Scifo

[57] ABSTRACT

A programmable logic array which uses random-access memories to replace read only memories conventionally used in programmable logic arrays. The programmable logic array includes input and output terminals, an input register connected to the input terminals, an output register connected to the output terminals, first and second random-access memories, addressing means for sequentially and cyclically reading the random-access memories, a buffer register having an input to the output of the second random-access memory and an output connected to the input of the output register, a comparator having a first input connected to the output of the first random-access memory and a second input connected to the output of the input and output registers, the output of the comparator controlling the transfer of the contents of the buffer register and means for resetting the buffer register.

6 Claims, 8 Drawing Figures

MULTIPLE-FUNCTION PROGRAMMABLE LOGIC ARRAYS

TECHNICAL FIELD

This invention relates to an improved method of implementing circuits that have used read only memories (ROM) to provide programmable logic arrays (PLAs). More particularly, the invention relates to such circuits which are adapted to perform multiple logic functions at the option of the user.

BACKGROUND OF THE INVENTION

As is well known, any complex logic function results from a combination of simple basic functions involving, in particular, AND and OR logic operations. The process made in the field of large scale integration (LSI) techniques has enabled manufacturers to develop and market new types of circuits called programmable logic arrays (PLAs) which are essentially comprised of matrices of elements performing AND and OR logic functions. In its simplest form, such a circuit comprises a matrix of AND circuits designated "AND matrix" and a matrix of OR circuits designated "OR matrix". The data to be processed are generally inputted to the AND matrix, which performs logic combinations of the AND type involving the input data and their complemented values. The terms provided by this matrix are then fed to the OR matrix where they are subjected to OR type logic operations. For some applications, the desired result is obtained at the output of the OR matrix, but other applications make it necessary to perform recurrent operations. In other words, data obtained at the output of the OR matrix is fed back to the input of the AND matrix. The desired result is then obtained upon completion of a sequential process, certain steps of which make use of the results obtained during the immediately preceding step. For the purposes of these functions, an output register is provided at the output of the OR matrix and the output of this register is connected to the input of the AND matrix. Although these logic arrays are termed "programmable", they do not have the ability to alter logic functions dynamically at the option of the programmer. In order to change functions, at least one of the matrices must be changed.

OBJECTS OF INVENTION

The present invention overcomes the disadvantage of fixed logic circuits used in prior art PLAs by providing means for selecting, altering and adding several functions.

The foregoing and other objects, features and advantages of the invention will be apparent from the following more particular description of a preferred embodiment of the invention, as illustrated in the accompanying drawings. It should be understood that the circuits and components described in the drawings are illustrative for the purposes of the embodiment described and that other circuits and components of greater or lesser complexity are equally suitable.

DESCRIPTION OF THE PRIOR ART

The operation of PLAs are described in a book entitled "MOS/LSI and Applications", by William N. Carr and Jack P. Mize, published by McGraw-Hill, Texas Instruments Electronics Series. PLAs are described in chapter 8 of this book. More specifically, FIGS. 8-4 thereof shows the basic components of a PLA comprising two matrices consisting of AND and OR circuits, respectively, and a feedback loop containing an output register. More detailed descriptions of exemplary applications are also provided.

Figure 1:
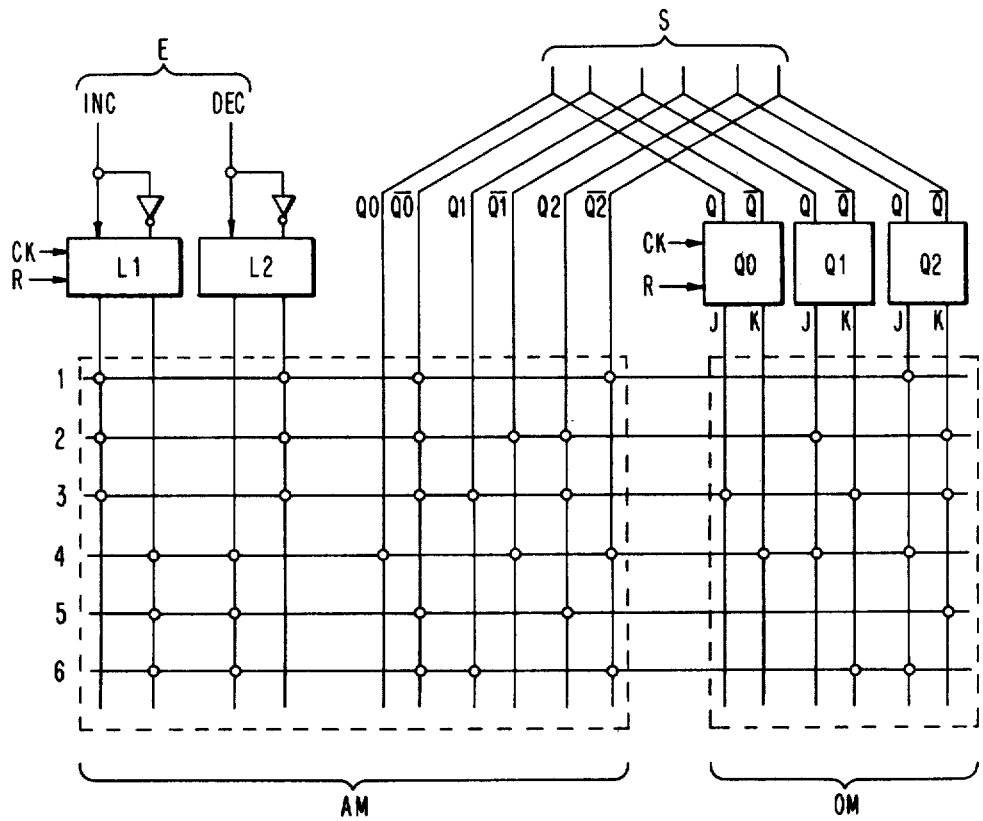
FIG. 1 is a schematic diagram of a prior art PLA device.

Referring now to FIG. 1, the basic components of an input PLA of the recurrent type as shown. These include an AND matrix designated AM which receives at E the input logic signals and their complements applied to an input register containing latches L1 and L2. The outputs from the matrix AM are fed to an OR matrix designated OM. The digital data representing the desired results are obtained at the output of OM through an output register containing latches Q0, Q1, Q2 and provided with parallel inputs and outputs. This register is wholly or partly used to store any data to be fed back as signals S to the matrix AM via the feedback loop shown extending between the latches Q0, Q1 and Q2 and the matrix AM. Clock signals (CK) and reset signals (R) are also provided to control the operations being performed.

The diagram of FIG. 1 makes it possible to realize a device intended to perform a given logic function by means of a sequence of operations during which the contents of the output register, stored at the time a given step was performed, is used during the next sequential step.

Figure 2:
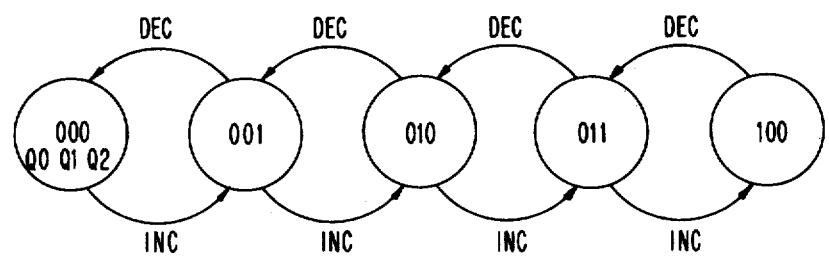
FIG. 2 is a schematic diagram illustrating the operation of the logic array programmed into the device of FIG. 1.

More specifically, to illustrate the use of the PLA of FIG. 1, assume that it is desired to realize an up and down counter operating in accordance with the diagram of FIG. 2 where "INC" and "DEC" refer to commands to increment and decrement the counter, respectively.

The corresponding truth table for the sequence of steps shown in FIG. 2 is as follows:

|     | INC (L1) | DEC (L2) | Q0 | Q1 | Q2 | Command |
|-----|----------|----------|----|----|----|---------|
| (1) | 1 | 0 | 0 | 0 | 0 | St Q2. |
| (2) | 1 | 0 | 0 | 0 | 1 | St Q1, Rst Q2. |
| (3) | 1 | 0 | 0 | 1 | 0 | St Q2. |
| (4) | 1 | 0 | 0 | 1 | 1 | St Q0, Rst Q1, Rst Q2. |
| (5) | 0 | 1 | 1 | 0 | 0 | Rst Q0, St Q1, St Q2. |
| (6) | 0 | 1 | 0 | 1 | 1 | Rst Q2. |
| (7) | 0 | 1 | 0 | 1 | 0 | Rst Q1, St Q2. |
| (8) | 0 | 1 | 0 | 0 | 1 | Rst Q2. |

The abbreviations "St" and "Rst" refer to commands to set and reset the latch concerned (Q0, Q1 or Q2), as required.

The logic functions to be performed are summarized in Table 1 below:

TABLE 1

| | LOGIC EQUATION | | FUNCTION |
|---|---|---|---|
| (1) | $L1.\overline{L2}.\overline{Q0}.\overline{Q1}.\overline{Q2}$ | $\rightarrow$ | St Q2. |
| (2) | $L1.\overline{L2}.\overline{Q0}.\overline{Q1}.Q2$ | $\rightarrow$ | St Q1, Rst Q2. |
| (3) | $L1.\overline{L2}.\overline{Q0}.Q1.\overline{Q2}$ | $\rightarrow$ | St Q2. |
| (4) | $L1.\overline{L2}.\overline{Q0}.Q1.Q2$ | $\rightarrow$ | St Q0, Rst Q1, Rst Q2. |
| (5) | $\overline{L1}.L2.Q0.\overline{Q1}.\overline{Q2}$ | $\rightarrow$ | Rst Q0, St Q1, St Q2. |
| (6) | $\overline{L1}.L2.\overline{Q0}.Q1.Q2$ | $\rightarrow$ | Rst Q2. |
| (7) | $\overline{L1}.L2.\overline{Q0}.Q1.\overline{Q2}$ | $\rightarrow$ | Rst Q1, St Q2. |
| (8) | $\overline{L1}.L2.\overline{Q0}.\overline{Q1}.Q2$ | $\rightarrow$ | Rst Q2. |

A conventional PLA performing the "up and down counter" function chosen by way of example would normally be obtained by transcribing the above table onto a read-only memory (ROM) during the manufacturing process. The left-hand part of the table would serve to personalize the matrix AM, and the right-hand part, the matrix OM.

The operation of a PLA using a ROM personalized with the logic functions of Table 1 will now be described. Firstly, it should be noted that the logic equations for positions (1) and (3) of Table 1 define the same functions, namely St Q2. In other words, $$L1.\overline{L2}.\overline{Q0}.\overline{Q1}.\overline{Q2} + L1.\overline{L2}.\overline{Q0}.Q1.\overline{Q2} = \text{St } Q2.$$

Accordingly, lines (1) and (3) may be replaced with a single line, namely, $$L1.\overline{L2}.\overline{Q0}.\overline{Q2} = \text{St } Q2.$$

Similarly, lines (6) and (8) become:

$$\overline{L1}.L2.\overline{Q0}.Q2 = \text{Rst } Q2.$$

Simplifying the 8 step logic functions of Table 1, the 6 step logic functions of Table 2 are obtained.

TABLE 2

| | LOGIC EQUATION | FUNCTION |
|---|---|---|
| (1) | $L1.\overline{L2}.\overline{Q0}. \quad \overline{Q2}$ | St Q2. |
| (2) | $L1.\overline{L2}.\overline{Q0}.\overline{Q1}.Q2$ | St Q1, Rst Q2. |
| (3) | $L1.\overline{L2}.\overline{Q0}.Q1.Q2$ | St Q0, Rst Q1, Rst Q2. |
| (4) | $\overline{L1}.L2.Q0.\overline{Q1}.\overline{Q2}$ | Rst Q0, St Q1, St Q2. |
| (5) | $\overline{L1}.L2.\overline{Q0}. \quad Q2$ | Rst Q2. |
| (6) | $\overline{L1}.L2.\overline{Q0}.Q1.\overline{Q2}$ | Rst Q1, St Q2. |

To perform these functions using a conventional PLA, one would personalize the ROMs by establishing "connections" (represented by dots in the matrices of FIG. (1) at the locations defined in Table 2. Note that set commands are applied to the J inputs of the latches Q0, Q1 and Q2 and reset commands are applied to the K inputs.

Once the ROMs have been personalized during the manufacturing process the function of the PLA is "frozen". Normally, the function can only be changed by changing the ROM.

It is often desirable, however, to use the same hardware to perform several logic functions at the option of the user or to alter or add logic functions. This object is attained by the PLA of the present invention.

DETAILED DESCRIPTION OF THE INVENTION

Figure 3:
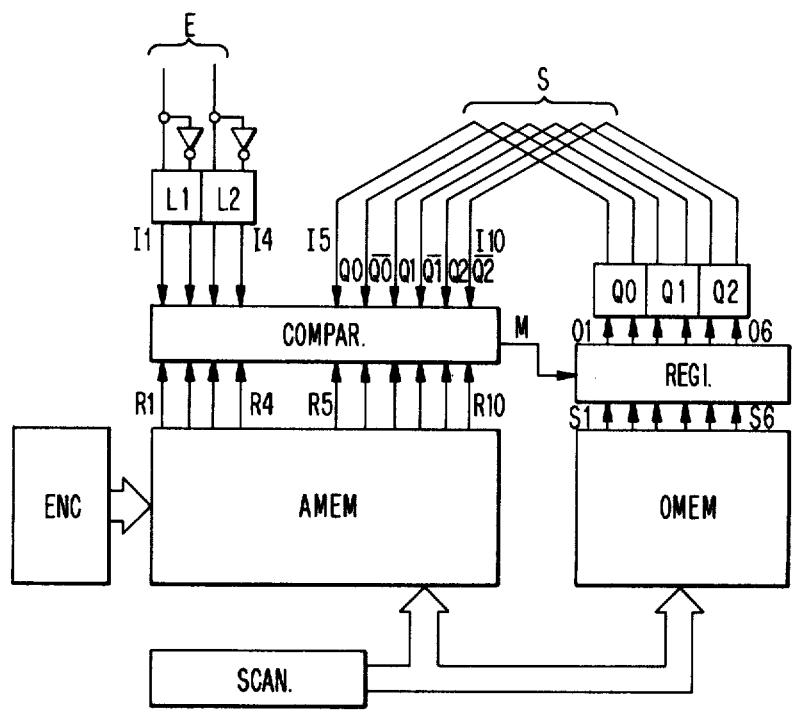
FIG. 3 is a schematic diagram illustrating the PLA of the invention.

The components of the PLA of the invention are shown schematically in FIG. 3. In this PLA, random-access memories (RAMs) designated AMEM and OMEM have been substituted for the ROMs of FIG. 1. The logic array further includes an encoder designated ENC, a buffer register designated REG1, a comparator designated COMPAR which controls the transfer of data through the register REG1, and a circuit designated SCAN which is used for sequentially and cyclically addressing the memories and for resetting the register REG1. Loading is performed by storing "1" bits in those positions which would be "connected" in the corresponding personalized matrices AM and OM of a ROM and "0" bits in the "not connected" positions. These write operations are all that is required to personalize the logic array for the purposes of a given function.

By way of an example the operation of the PLA of the present invention will be described in connection with the up and down counter of the prior art PLA which was previously described.

Referring to Table 2, the contents of the AMEM and OMEM would be as shown below in Table 3. The significance of the designations R1, R2 . . . R10 and 01, 02, . . . 06 is discussed hereinbelow.

TABLE 3

| | L1 | $\overline{L1}$ | L2 | $\overline{L2}$ | Q0 | $\overline{Q0}$ | Q1 | $\overline{Q1}$ | Q2 | $\overline{Q2}$ | Q0 J | Q0 K | Q1 J | Q1 K | Q2 J | Q2 K |
|---|---|---|---|---|---|---|---|---|---|---|---|---|---|---|---|---|
| | R1 | R2 | R3 | R4 | R5 | R6 | R7 | R8 | R9 | R10 | 01 | 02 | 03 | 04 | 05 | 06 |
| (1) | 1 | 0 | 0 | 1 | 0 | 1 | 0 | 0 | 0 | 1 | 0 | 0 | 0 | 0 | 1 | 0 |
| (2) | 1 | 0 | 0 | 1 | 0 | 1 | 0 | 1 | 1 | 0 | 0 | 0 | 1 | 0 | 0 | 1 |
| (3) | 1 | 0 | 0 | 1 | 0 | 1 | 1 | 0 | 1 | 0 | 1 | 0 | 0 | 1 | 0 | 1 |
| (4) | 0 | 1 | 1 | 0 | 1 | 0 | 0 | 1 | 0 | 1 | 0 | 1 | 1 | 0 | 1 | 0 |
| (5) | 0 | 1 | 1 | 0 | 0 | 1 | 0 | 0 | 0 | 1 | 0 | 0 | 0 | 0 | 0 | 1 |
| (6) | 0 | 1 | 1 | 0 | 0 | 1 | 1 | 0 | 0 | 1 | 0 | 0 | 0 | 1 | 1 | 0 |
| | | | | | AMEM | | | | | | | | OMEM | | | |

If the bits applied by the memory AMEM to one of the inputs of the comparator COMPAR are designated "Ri" and the bits applied to the other input of the comparator are designated "Ii", the comparison will provide a result M=1 when $$\pi(Ri.Ii + \overline{Ri}) = 1 \tag{1}$$

The validity of expression: M=1 when $\pi(R1.I1 + \overline{R1}) = 1$ can be demonstrated by examining the results obtained when address 1 of the AMEM is scanned. From Table 3 it is seen that the values of R1, R2 ... R10 are as follows:

| | | |
|---|---|---|
| R1 = 1 | therefore | R1.I1 + $\overline{R1}$ = I1 |
| R2 = 0 | | R2.I2 + $\overline{R2}$ = 1 |
| R3 = 0 | | R3.I3 + $\overline{R3}$ = 1 |
| R4 = 1 | | R4.I4 + $\overline{R4}$ = I4 |
| R5 = 0 | | R5.I5 + $\overline{R5}$ = 1 |
| R6 = 1 | | R6.I6 + $\overline{R6}$ = I6 |
| R7 = 0 | | R7.I7 + $\overline{R7}$ = 1 |
| R8 = 0 | | R8.I8 + $\overline{R8}$ = 1 |
| R9 = 0 | | R9.I9 + $\overline{R9}$ = 1 |
| R10 = 1 | | R10.I10 + $\overline{R10}$ = I10 |

$\pi(Ri\ Ii + Ri) = 1$ means that for every term with a personalization (Ri=1), the other input (Ii) to the comparator must be high (Ii=1) and for every term without a personalization, the state of the relevent input does not matter.

Relation (1) can be manipulated by Boolean algebra and rewritten as:

$$\pi(\overline{Ri} + Ii) = 1 \tag{2}$$

Figure 5:
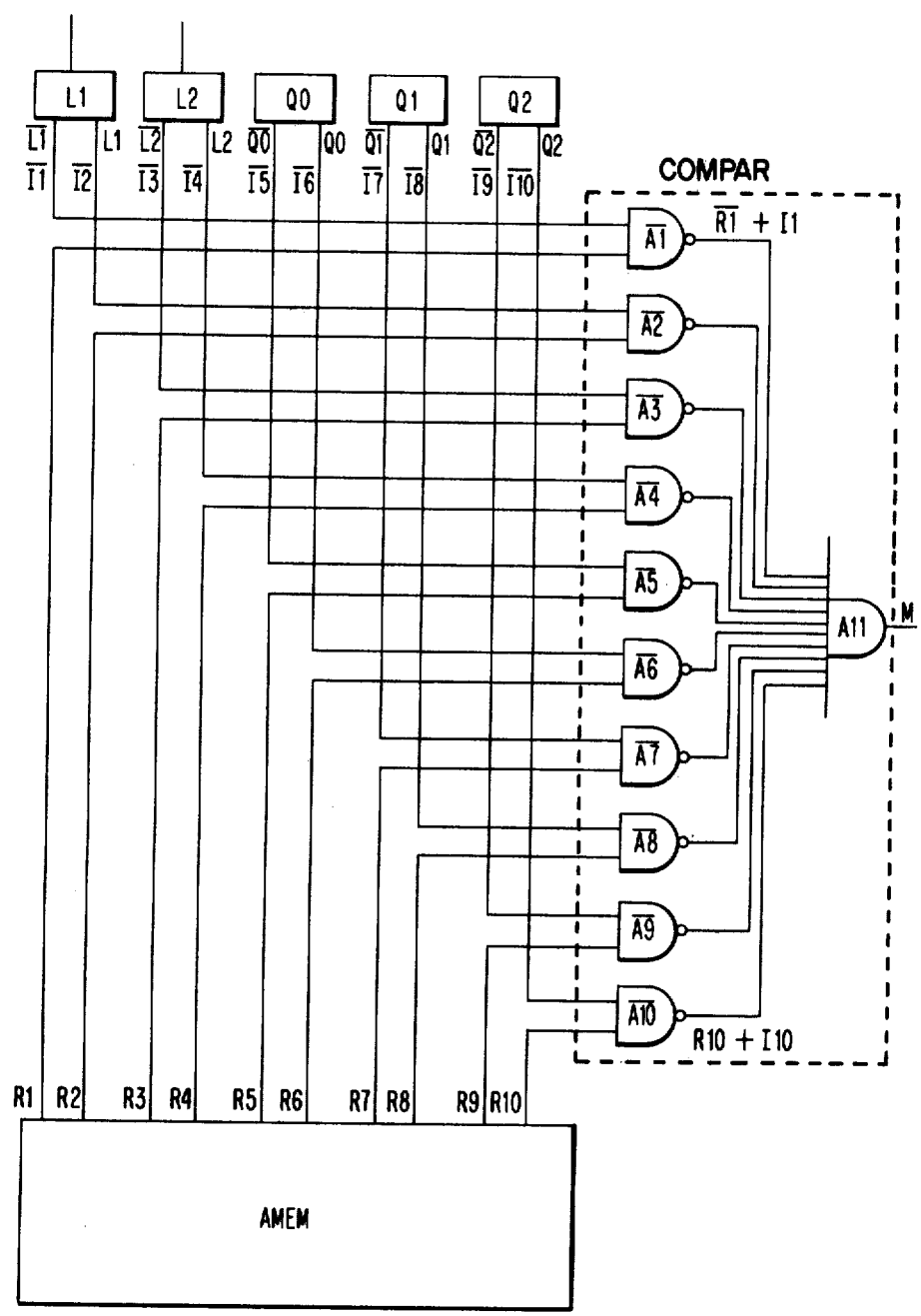

The circuit of FIG. 5 performs the function of relation (2). The inverted function $\overline{Ii}$ indicated in FIG. 5 is required for operation of relation (2). The function $\overline{Ii}$ can be obtained through the simple expedient of inverting the outputs of L1, L2, Q0, Q1 and Q2. To perform the function $\overline{Ii}.Ri$, which is equivalent to $\overline{R1+Ii}$ by De Morgan's theorem, logic circuits designated $\overline{A1}$ to $\overline{A10}$ which perform the function $\overline{AND}$ have been provided. A circuit designated A11 which performs the logic function AND is also provided. Since A11 is an AND function M=1 only when each of $\overline{A1}$ thru $\overline{A10}$ is 1.

Whenever the output M=1, the contents of buffer register REG1 is updated. The contents of REG1 are transferred to the output register (Q0, Q1, Q2) after each successive address in the memory AMEM and OMEM have been scanned by the circuit SCAN.

The addressing circuit (SCAN) includes a modulo 8 counter which sequentially and simultaneously addresses the lines of the two RAMs at a rate eight times higher than that at which the clock signals CK are provided. At the count of zero, the counter addresses line (1) of the memories. At the count of one, it addresses line (2), and so forth through the count of five. At the count of six, the counter causes the input register of AMEM and output register of OMEM to be reset, in the same way as the clock signal CK did in the PLA of FIG. 1. At the count of seven, the counter resets the buffer register REG1.

Figure 4:
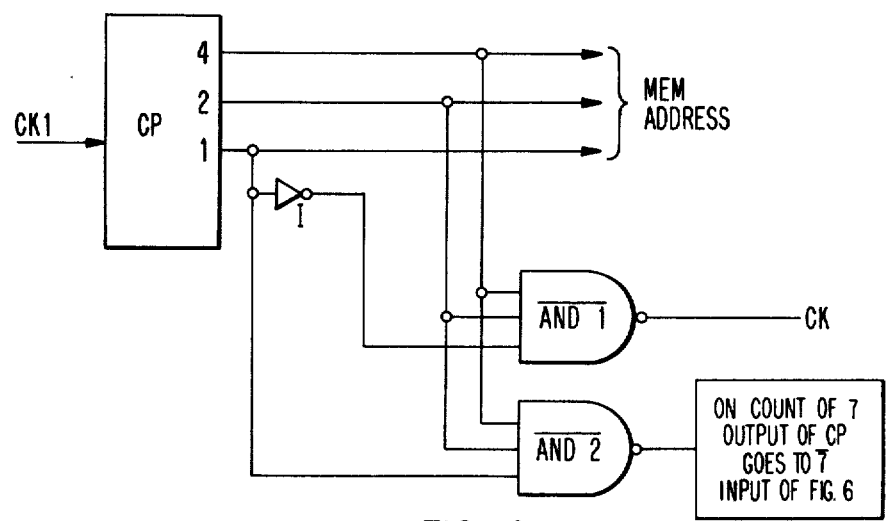
FIGS. 4-6 show details of the circuits of the components of the invention in an embodiment suitable for duplicating the logic array illustrated in FIG. 1.

An embodiment of the addressing circuit (SCAN) is illustrated in FIG. 4. This embodiment includes a 3-bit counter CP, two logic circuits $\overline{AND1}$ and $\overline{AND2}$, and an inverter I. The circuit $\overline{AND2}$ supplies the logic data for resetting the buffer register REG1 to be described later. The output from AND1 provides the clock signal CK. The counter CP is incremented by a signal CK1 generated eight times faster than CK.

Figure 6:
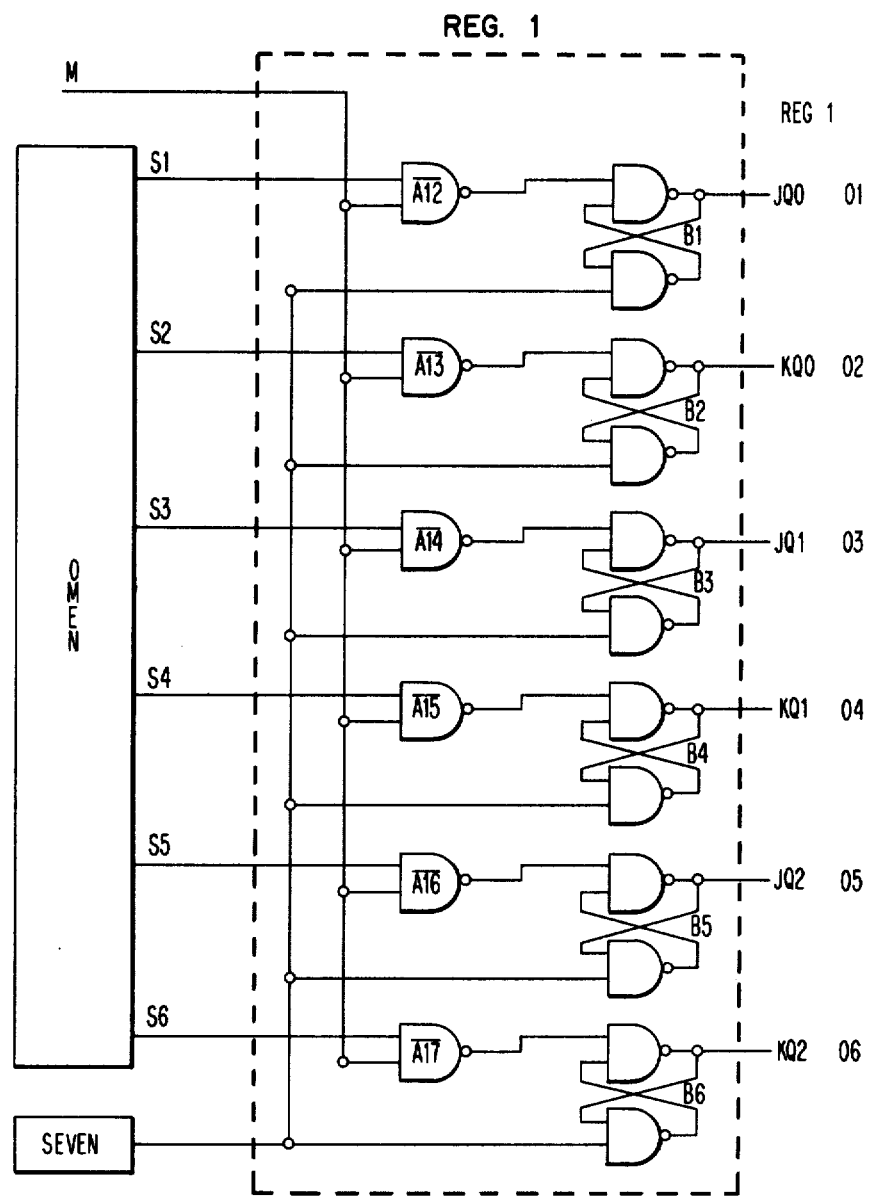

An embodiment of buffer register REG1 is shown in FIG. 6. This device is essentially comprised of circuits performing the logic function $\overline{AND}$. Some of these circuits, designated $\overline{A12}$ to $\overline{A17}$, serves as gates which are opened by M. The other circuits are connected in pairs to form bistable flip flop latches B1 to B6 which are loaded with the outputs from the circuits $\overline{A12}$ to $\overline{A17}$ and are reset by the output from $\overline{AND2}$ mentioned above.

The function of the buffer register REG1 is to perform the OR function 01, 02 . . . 06 of Table 3 at the outputs of the buffer register REG1. These OR functions are performed sequentially by the circuit shown in FIG. 6. At time 0, the scan counter equals 0, the six latches B1 to B6 are reset. At time 1, scan counter CK1 equals 1 and the S signals obtained from address 1 of the OMEM are S1=0, S2=1, S3=0, S4=0, S5=1 and S6=0 (see line 1 of OMEM Table 3). M is transferred into B5 which is the only latch receiving a 1 bit from the address 1 scan of the OMEM. The other latches remain unchanged. The other address rows of OMEM are scanned on successive counts and the information is stored in REG1. The information pertaining to 01, 02 . . . 06 values is released on each successive count to effect the up and down counter set and reset functions previously described. Therefore, 01, 02 . . . 06 values are the final values and these values are the same as those which would have been obtained with the conventional PLA of FIG. 1.

The memories AMEM and OMEM are simultaneously addressed by the same address generator. Consequently, these memories can be combined into a single element.

The embodiment described above may be used for other applications without having to modify the hardware in any way. Only the contents of the memories need be changed.

Figure 7:
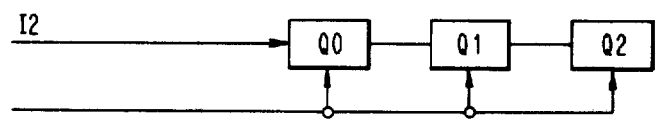
FIGS. 7 and 8 illustrate a further application of the PLA of the invention as used to perform an additional function.

By way of example, assume that an additional function desired is a "shift register" comprising three bit positions (Q0, Q1, Q2) as shown in FIG. 7. The input I2 is used to load data into the register and the input I1 is used to cause the data to be shifted to the right (see FIG. 7). When I1 is low, the new data is loaded in Q0, the contents of Q0 is transferred to Q1 and that of Q1 to Q2. When I1 is high, the contents of the register remains unchanged.

Figure 8:
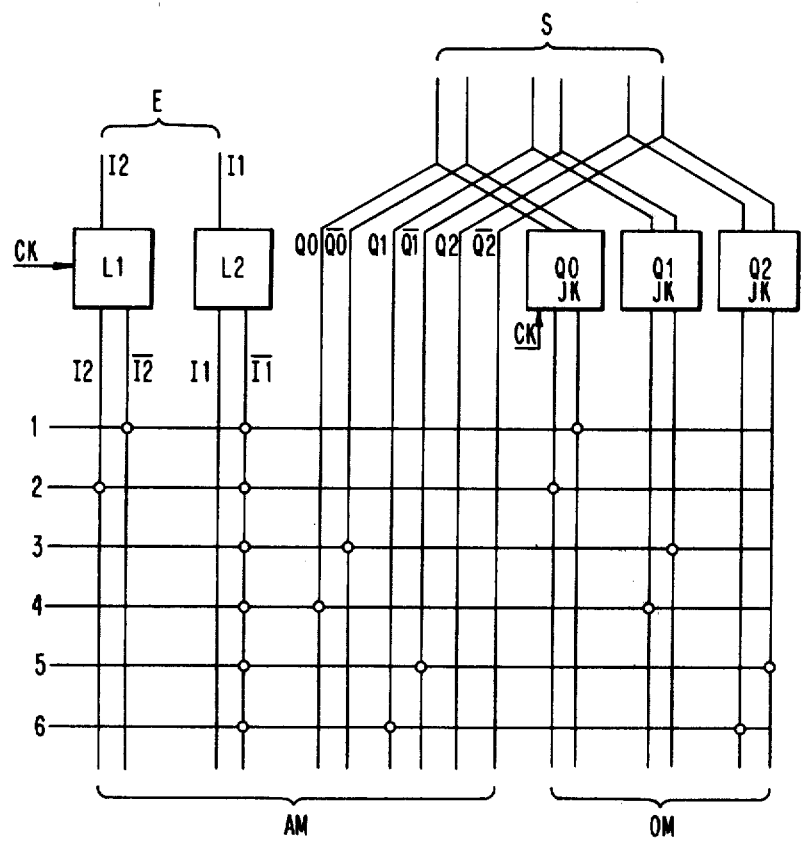

FIG. 8 shows a conventional PLA capable of performing the desired "shift register" function. A comparison between the diagram of this figure and that of FIG. 1 clearly shows that it would be necessary to change the matrices AM and OM of FIG. 1 to convert the up and down counter to a shift register.

However, according to the present invention, this change in function merely requires modifying the contents of the memories AMEM and OMEM. For the purposes of the desired "shift register" function, the AMEM and OMEM would be loaded in accordance with the following table.

TABLE 4

| | AMEM | | | | | | | | | | OMEM | | | | | |
|---|---|---|---|---|---|---|---|---|---|---|---|---|---|---|---|---|
| | | | | | | | | | | | Q0 | | Q1 | | Q2 | |
| | L1 | $\overline{L1}$ | L2 | $\overline{L2}$ | Q0 | $\overline{Q0}$ | Q1 | $\overline{Q1}$ | Q2 | $\overline{Q2}$ | J | K | J | K | J | K |
| (1) | 0 | 1 | 0 | 1 | 0 | 0 | 0 | 0 | 0 | 0 | 0 | 1 | 0 | 0 | 0 | 0 |
| (2) | 1 | 0 | 0 | 1 | 0 | 0 | 0 | 0 | 0 | 0 | 1 | 0 | 0 | 0 | 0 | 0 |
| (3) | 0 | 0 | 0 | 1 | 0 | 1 | 0 | 0 | 0 | 0 | 0 | 0 | 0 | 1 | 0 | 0 |
| (4) | 0 | 0 | 0 | 1 | 1 | 0 | 0 | 0 | 0 | 0 | 0 | 0 | 1 | 0 | 0 | 0 |
| (5) | 0 | 0 | 0 | 1 | 0 | 0 | 0 | 1 | 0 | 0 | 0 | 0 | 0 | 0 | 0 | 1 |
| (6) | 0 | 0 | 0 | 1 | 0 | 0 | 1 | 0 | 0 | 0 | 0 | 0 | 0 | 0 | 1 | 0 |

The other components of the PLA of the invention; that is, the SCAN, COMPAR and REG1 would operate as previously described to effect the shift register function.

While the invention has been particularly shown and described with reference to a preferred embodiment thereof, it will be understood by those skilled in the art that numerous changes in form and detail may be made therein without departing from the spirit and scope of the invention.

Having thus described my invention, what I claim as new, and desire to secure by Letters Patent is:

1. A programmable logic array comprising:
   a. an input terminal;
   b. an output terminal;
   c. an input register connected to the input terminal;
   d. an output register connected to the output terminal;
   e. a first random access memory adapted to receive a prescribed data pattern;
   f. a second random access memory adapted to receive a prescribed data pattern complimentary to the data pattern of the first randon access memory;
   g. a buffer register having an input connected to the output of the second random access memory and an output connected to the input of the output register;
   h. means for resetting the buffer register;
   i. a comparator having a first input connected to the output of the first random access memory and a second input connected to the output of the input register and the output of the output register, the comparator output controlling the transfer of the buffer register contents; and
   j. addressing means connected to the first random access memory and the second random access memory for sequentially and cyclically presenting segments of the first random access memory data pattern to the comparator and segments of the second random access memory data pattern complimentary to the data segment of the first memory to the buffer register such that when the inputs to the comparator satisfy a prescribed condition, the comparator output causes transfer of the buffer register contents.

2. The programmable logic array of claim 1 wherein the contents of the buffer register are transferred to the output shift register when the buffer register receives a control signal from the comparator.

3. A programmable logic array in accordance with claim 2, wherein the presonalization thereof is achieved by loading a prescribed data pattern into the said first and second memories.

4. A programmable logic array in accordance with claim 3, wherein the memories are loaded by storing "1" bits in the positions corresponding to those which would be connected in a read only memory and "0" bits in the other positions.

5. Programmable logic array in accordance with any one of claims 2 to 4, wherein said buffer register is loaded under control of the output from said comparator and in that it is reset under control of said addressing means.

6. A shift register in accordance with any one of claims 2 to 5.

* * * * *